Sept. 10, 1968 B. G. WATKINS 3,401,319

INTEGRATED LATCH CIRCUIT

Filed March 8, 1966

INVENTOR.
BOYD G. WATKINS

BY Jack M. Wiseman

ATTORNEY

United States Patent Office 3,401,319
Patented Sept. 10, 1968

3,401,319
INTEGRATED LATCH CIRCUIT
Boyd G. Watkins, San Francisco, Calif., assignor to General Micro-Electronics Inc., Santa Clara, Calif., a corporation of Delaware
Filed Mar. 8, 1966, Ser. No. 532,601
4 Claims. (Cl. 317—235)

ABSTRACT OF THE DISCLOSURE

Bistable integrated circuit comprising insulated gate field effect, PNP, and NPN transistors. FET provides high input impedance and drives bipolar transistors, which are cross-coupled in bistable configuration. Several regions of IC wafers serve a plurality of functions.

The present invention relates in general to semiconductor devices, and more particularly to a novel structure comprising unipolar and bipolar transistors and a circuit formed therefrom.

An object of the present invention is to provide a novel semiconductor device which can serve as a latch or switch.

Another object is to provide a latch which can be initiated from a high impedance input terminal.

A further object is to provide a latch employing an insulated gate field effect device.

Other and further objects and advantages will be apparent to one skilled in the art from the following description taken in conjunction with the accompanying drawings, in which.

Figure 1:
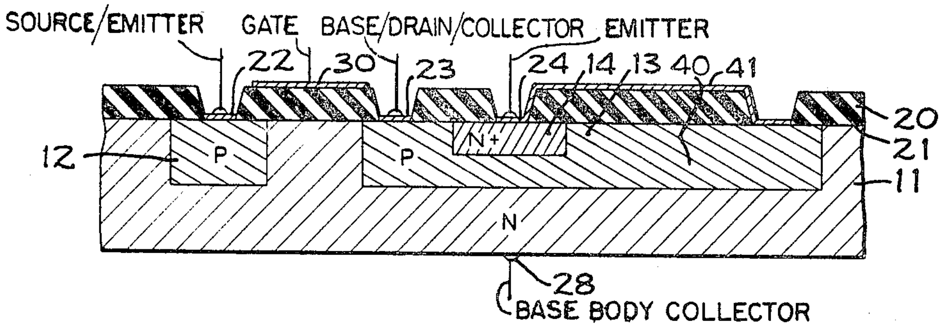
FIG. 1 is an enlarged vertical sectional view of the semiconductor device embodying the present invention.

Illustrated in FIG. 1 is the semiconductor device of the present invention, which comprises a body or substrate 11 of semiconductor material, such as silicon. Body 11 is doped in a conventional manner with an N-type impurity, such as antimony, arsenic, or phosphorous. Body 11 includes P-type regions 12 and 13, which are formed by the diffusion of boron or indium. An N+ type diffused region 14 is formed within P-type region 13.

An insulating layer 20, preferably of silicon dioxide, is thermally grown on the planar surface 21 of the body in a well-known manner.

Contacts 22, 23 and 24 are attached to surface portions of the respective regions 12, 13, and 14 through holes in oxide layer 20. A contact 28 is attached to the lower surface of base 11 by a gold die-attach procedure.

A gate electrode 30 is formed over insulating layer 20 above the region of body 11 between the confronting end portions of regions 12 and 13.

The semiconductor device of FIG. 1 operates in combination as an insulated gate field-effect transistor, a lateral PNP transistor and a planar NPN transistor.

The insulated gate field-effect transistor (FET) employs region 12 as a source, region 13 as a drain, substrate 11 as a body, an electrode 30 as a gate.

The lateral PNP transistor employs region 12 (the source of the FET) as an emitter region 11 (the body of the FET) as a base, and region 13 (the drain of the FET) as a collector.

The planar NPN transistor employs region 14 as an emitter, region 13 (the drain of the FET and collector of the lateral transistor) as a base, and region 11 (the body of the FET and base of the lateral transistor) as a collector.

The P-type base region 13 of the planar transistor is elongated to the right so that the right hand portion 40 thereof can serve as an internal resistor. Emitter contact 24 has a portion 41 extending over oxide layer 20 which contacts region 40 at the right end thereof so as to connect this internal resistor 40 between the base and emitter regions of the planar PNP transistor.

Figure 2:
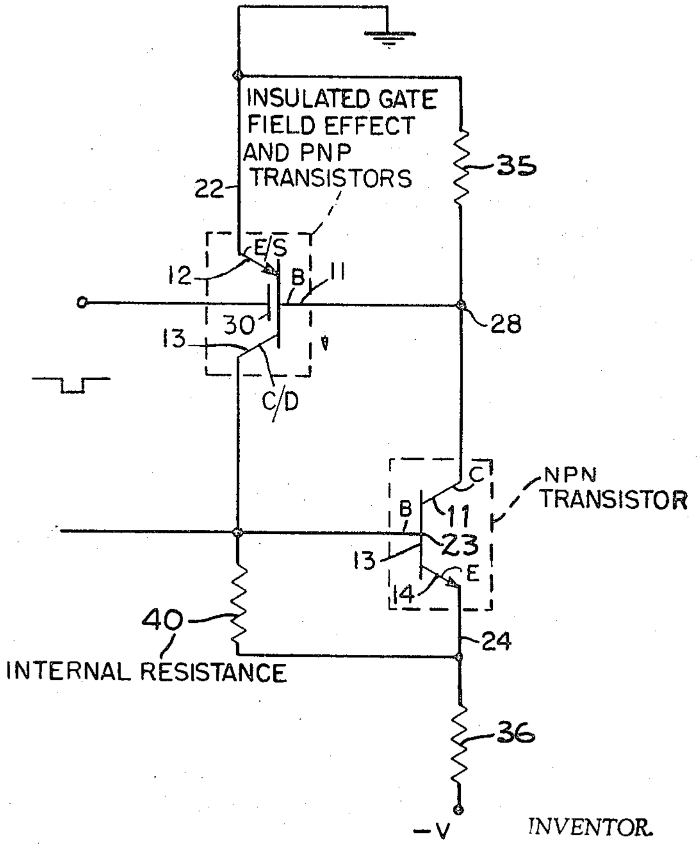
FIG. 2 shows a latch circuit including the device shown FIG. 1.

FIG. 2 shows a latch circuit which includes the device of FIG. 1 (shown in equivalent circuit form), together with several external connections and two external resistors 35 and 36. Resistor 36 is connected between emitter contact 24 and a negative potential source —V and resistor 35 is connected between contact 28 and ground. Contact 22 is also connected to ground. Since the source and drain regions of the field effect transistor and the emitter and collector regions of the lateral PNP transistor are respectively identical, these two transistors are shown in FIG. 2 as a single transistor with both a base and an insulated gate electrode.

In operation, a negative potential applied to gate electrode 30 of sufficient magnitude causes a conductive channel to be created in body 11 between the source and drain regions 12 and 13. Thus, a current flow is created between source electrode 22 and drain electrode 23 over a path including source region 12, body 11 and drain region 13.

The current flow into the region 13, which also is the base region of the NPN planar transistor, will be multiplied by the beta of this transistor, creating a relatively large current flow into region 11, the collector for the NPN transistor.

By making resistance 35 sufficiently large, the majority of the NPN transistor's collector current will flow through the base region of the PNP transistor. As a result, the current between regions 12 and 13 will be increased by collector current created in the PNP transistor.

The PNP transistor's collector current in region 13 will be added to the initial NPN transistor's base current. If the product of the betas of the NPN and PNP transistor is sufficiently large, latch action will occur, causing both transistors to remain conductive even though the negative potential is removed from gate electrode 30. The transistors can be restored to their initial state by interrupting the bias source —V.

It should be noted that this latch action can be achieved without a four layer structure and, can be initiated using very high input impedance gate electrode.

It is to be understood that modifications and variations of the invention disclosed herein may be resorted to without departing from the spirit of the invention and the scope of the appended claims.

I claim:

1. A latch circuit comprising:

(a) an integrated circuit comprising a body of one conductivity type having a planar surface, first and second separated regions of the opposite conductivity type extending into said body from separate areas of said surface, a third region of said one conductivity type extending into said second region from an area of said surface entirely within the surface area of said second region, a conductive gate electrode insulated from but over the surface of the portion of said body between said first and second regions, and first, second, third, and fourth contacts to said first, second, and third regions, and said body, respectively, whereby said first region, said body, and said second region can serve as the emitter base, and collector of a lateral transistor, said first region, said gate electrode, and said second region can serve as the source, gate, and drain of insulated gate field effect transistor, and said third region, said second region, and said body can serve as the emitter, base, and collector of a planar transistor, (b) means connecting said first contact to said fourth contact by a first resistance, (c) means connecting said second contact to said third contact via a second resistance, and (d) a bias source and a load impedance connected in series between said first and third contacts.

2. The circuit of claim 1 wherein said second region is elongated, said third region is formed in one end of said second region, said second contact is attached to a point on the surface of said second region near said third region, and including a connection extending from said third contact to a point on the surface of said second region near the other end thereof remote from said third region such that a part of said second region will serve as said second resistance.

3. The circuit of claim 1, further including means for supplying an input signal between the gate and drain electrodes of said field effect transistor, said signal having a polarity tending to turn on said field effect transistor.

4. The circuit of claim 1 wherein said body and said third region are of N-type conductivity and first and second regions are of P-type conductivity.

References Cited

UNITED STATES PATENTS 3,264,493 8/1966 Price ............ 307—88.5

JOHN W. HUCKERT, *Primary Examiner.*

M. H. EDLOW, *Assistant Examiner.*